United States Patent [19]

Doty, II

[11] Patent Number: 4,488,065

[45] Date of Patent: Dec. 11, 1984

[54] SENSING AND LOGIC FOR MULTIPLE BIT PER CELL ROM

[75] Inventor: James H. Doty, II, Springboro, Ohio

[73] Assignee: NCR Corporation, Dayton, Ohio

[21] Appl. No.: 408,541

[22] Filed: Aug. 16, 1982

[51] Int. Cl.³ .................... H03K 5/24; H03K 5/153
[52] U.S. Cl. .................... 307/350; 307/360; 307/363; 324/57 R
[58] Field of Search ............ 307/350, 530, 355, 356, 307/358, 360, 361, 362, 363; 324/57 R, 73 R; 365/182, 187, 188

[56] References Cited

U.S. PATENT DOCUMENTS

| | | |
|---|---|---|
| 3,979,606 | 9/1976 | Ahmed . |
| 4,047,059 | 9/1977 | Rosenthal . |
| 4,069,431 | 1/1978 | Kucharewski . |
| 4,142,118 | 2/1979 | Guritz ................. 307/358 |
| 4,192,014 | 3/1980 | Craycraft . |

OTHER PUBLICATIONS

R. E. Myrick, (Mostek Corp.), "Multi-Bit Read Only Memory Cell Sensing Circuit", International Publication No. WO82/02276, Jul. 8, 1982.
M. Stark, "Two Bits Per Cell ROM", 1981 *IEEE*, pp. 209-212.
I. A. Young, "A High-Performance All-Enchancement NMOS Operational Amplifier", IEEE J. Solid-State Circuits, vol. SC-14, No. 6, pp. 1070-1077, Dec. 1979.
Y. P. Tsividis, D. L. Fraser, and J. E. Dziak, "A Process-Insensitive High-Performance NMOS Operational Amplifier, IEEE J. Solid-State Circuits, vol. SC-15, No. 6, pp. 921-928, Dec. 1980.
John G. Posa, "Four-State Cell Doubles ROM Bit Capacity", Electronics, Oct. 9, 1980.
J. Robert Lineback, "Four-State Cell Called Density Key", Electronics, Jun. 30, 1982.

*Primary Examiner*—John Zazworsky
*Attorney, Agent, or Firm*—J. T. Cavender; Casimer K. Salys

[57] ABSTRACT

A sensing circuit for determining the amplitude of an unknown impedance by comparing the voltage levels generated in a succession of current mirror circuits. In one form, the present circuit is connected to a ROM array comprised of FET devices having the potential of $2^n$ different channel structures, impedances, to represent n different bits of data. When addressed, the selected ROM FET is coupled to a current mirror reference FET, whose commonly connected gate and drain electrodes are further coupled to a succession of $2^n - 1$ current mirror FETs. Each of the current mirror FETs is connected in conductive series with an incrementally different impedance, the value of each impedance lying substantially midway between the $2^n$ potential impedances possible in the ROM cell FET. The voltages on the current mirror FETs are individually compared to the voltage on the current mirror reference FET to generate a digital format representation of the relative magnitudes. The n data bits in the addressed ROM cell are then decoded by digital logic blocks.

10 Claims, 4 Drawing Figures

SENSING AND LOGIC FOR MULTIPLE BIT PER CELL ROM

BRIEF SUMMARY

The present invention relates to electronic semiconductor devices implemented in high density memory arrays. With greater particularity, the invention comprises an integrated sensing and logic circuit suitable to decode multi-level bit data stored in a read-only memory (ROM), which ROM is comprised of field effect transistor (FET) memory cells configured to store n bits of data per FET.

In one form, the decoded output of a multiple bit per cell ROM, exemplified by the configuration described in U.S. Pat. No. 4,192,014 (assigned to the assignee of the present invention), is coupled to the commonly connected gate and drain electrodes of a current mirror reference FET. The gate electrode of the current mirror reference FET is itself coupled to a bank of $2^n - 1$ current mirror circuits, with each circuit containing a current mirror FET and a serially connected, incrementally distinguishable impedance. Each current mirror bank is followed by a differential amplifier suitable to compare the voltage across the current mirror reference FET with the voltage on the current mirror FET in the corresponding bank. An appropriate selection of the serial impedances for the succession of banks allows the differential amplifiers to distinguish among the $2^n - 1$ different impedance levels possible in each memory cell FET of the ROM array. Thereafter, logic circuitry decodes the binary outputs from the differential amplifiers to determine the actual binary composition of the n bits of data in the ROM cell addressed.

The accuracy of the current mirror arrangement is substantially attributable to the fact that the dimensions and operational characteristics of all current mirror FETs are exceptionally consistent, irrespective of minor processing variations, by virtue of their proximity in location and process environment. These and other benefits, together with various functional and structural attributes, will become more apparent upon considering the embodiment described hereinafter.

DETAILED DESCRIPTION

The commercial demand for significant increases in the volume of data available from addressable memory arrays fabricated on semiconductor chips is pressing the ability of memory designers to scale down the dimensions of memory devices, typically FETs, in the pursuit of greater data storage density. A particularly viable alternative to the pure scaling of FET dimensions is described in U.S. Pat. No. 4,192,014. One aspect of the patent teaches that prescribed relative variations in ROM FET dimensions can be utilized to increase the number of information bits which can be stored in each single FET ROM cell. By virtue of the relevance of U.S. Pat. No. 4,192,014, the subject matter thereof is incorporated herein by reference.

Figure 1:
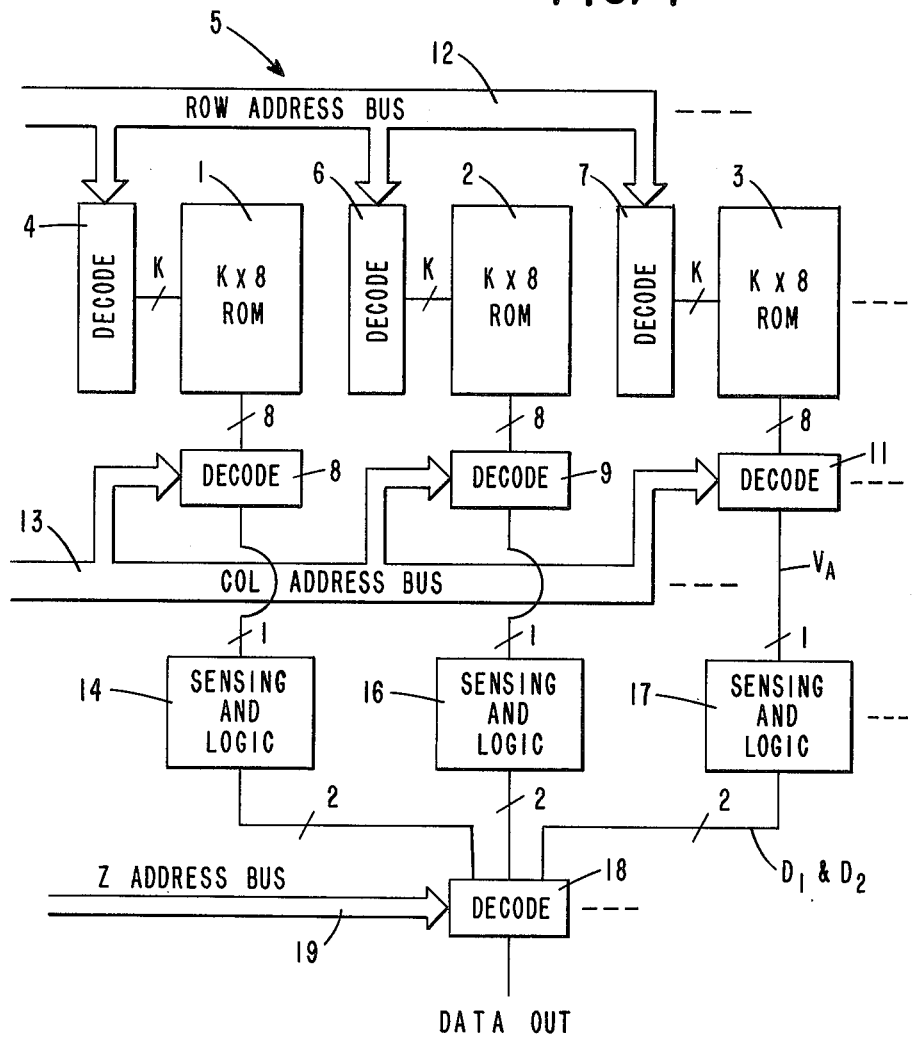
FIG. 1 is a schematic block diagram of a composite ROM array.

FIG. 1 of the present drawings depicts an illustrative embodiment of a Composite ROM System, 5, according to the general teaching of the aforementioned U.S. patent. In particular, there are shown three banks of $K \times 8$ ROM Cell Arrays, 1, 2, and 3, which are selected by respective Row Decoders 4, 6, and 7, and Column Decoders 8, 9, and 11 according to the address bits on Row Address Bus 12 and Column Address Bus 13. The output of each Column Decoder, 8, 9 and 11, appears on a single bit line, i.e. $V_A$, but is characterized by its variability of voltage amplitude in prescribed relation to the width-to-length ratio (W/L) of the FET channel for the ROM cell addressed.

The focus of the present invention is on the Sensing And Logic blocks, 14, 16 and 17, which convert analog variations in the W/L ratio of the addressed FET channels into useful digital data on two or more bit lines. Supplemental Decoder 18, in FIG. 1, further selects data according to the address on Z Address Bus 19.

It will no doubt be appreciated that the present embodiment perceives a Composite ROM System in which each FET cell is capable of storing two bits of information, accessible on two bit lines such as $D_1$ and $D_2$. Therefore, in terms of the structural configuration illustrated in FIG. 1, the capacity of each $K \times 8$ ROM Array, 1, 2 or 3, is functionally equivalent to a $K \times 16$ ROM Array.

The organization of Composite ROM System 5 in FIG. 1 reflects the effects of other design considerations which vary according to the final objectives of the ROM designer. For instance, the grouping of ROM cells into $K \times 8$ arrays is influenced by the general preference for a square ROM layout in attempting to optimize the utilization of chip area. The presently preferred arrangement is eight banks of $128 \times 8$ ROM Cell Arrays.

Similarly, the arrangement of eight columns per array illustrates the impact of another design consideration, an optimization of the Composite ROM System operating speed. In this case the number of columns balanced the effort to minimize the capacitive loads on critical nodes, i.e. node $V_a$ in FIG. 1, against the chip area lost with additional Sensing And Logic blocks. As will be recognized from the ensuing description, grouping of ROM cells into individual banks of eight columns limits the capacitive load coupled to the current mirror reference FET in each Sensing And Logic block. This implication of the load may be better understood by observing that the single input line to each Sensing And Logic block, 14, 16 or 17, is the common node for the all eight address FETs electrically attached to the single output from each Decode block, 8, 9 or 11. These and other design considerations are no doubt within the understanding of those versed in the related art.

Figure 2:
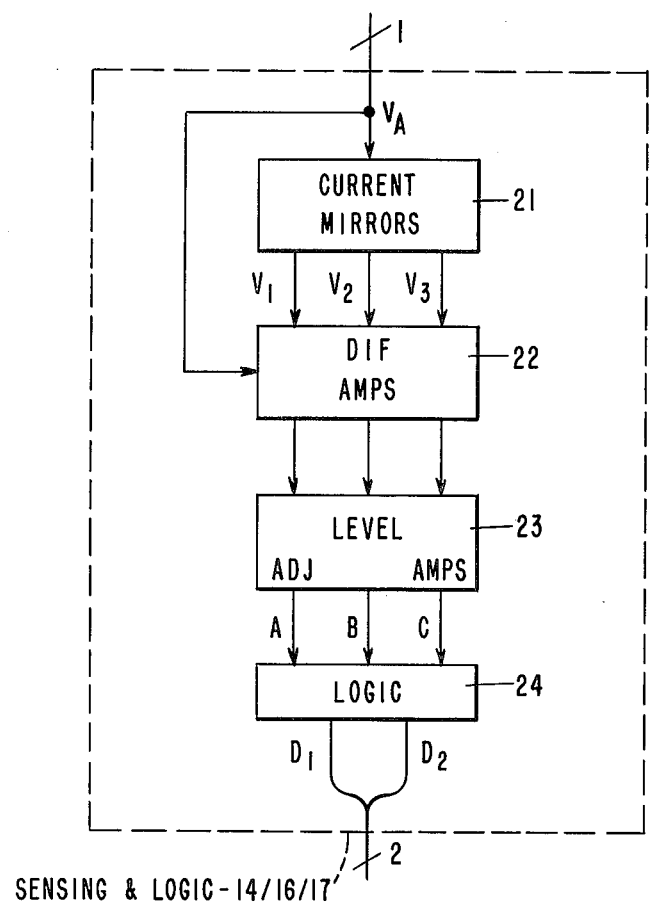
FIG. 2 is a schematic block diagram of the sensing and logic segment of the composite ROM array.

Sensing And Logic blocks 14, 16 and 17 from FIG. 1 are shown with greater detail in FIG. 2. As embodied, each Sensing And Logic block is comprised of Current Mirrors 21, Differential Amplifiers 22, Level Adjusting Amplifiers 23, and Logic 24. Representative integrated circuits for Current Mirrors 21, Differential Amplifiers 22 and Level Adjusting Amplifiers 23 are depicted in FIG. 3, while one example of a logic circuit suitable to perform the function ascribed to block 24 appears in FIG. 4.

The central feature of the present invention resides in the ability of the Sensing And Logic blocks, 14, 16 and 17, to differentiate between incrementally different levels of analog voltages and generate corresponding binary data bits, in the general sense of analog to digital conversion. The circuit structure of an integrated configuration is shown in FIG. 3 of the drawings.

Figure 3:
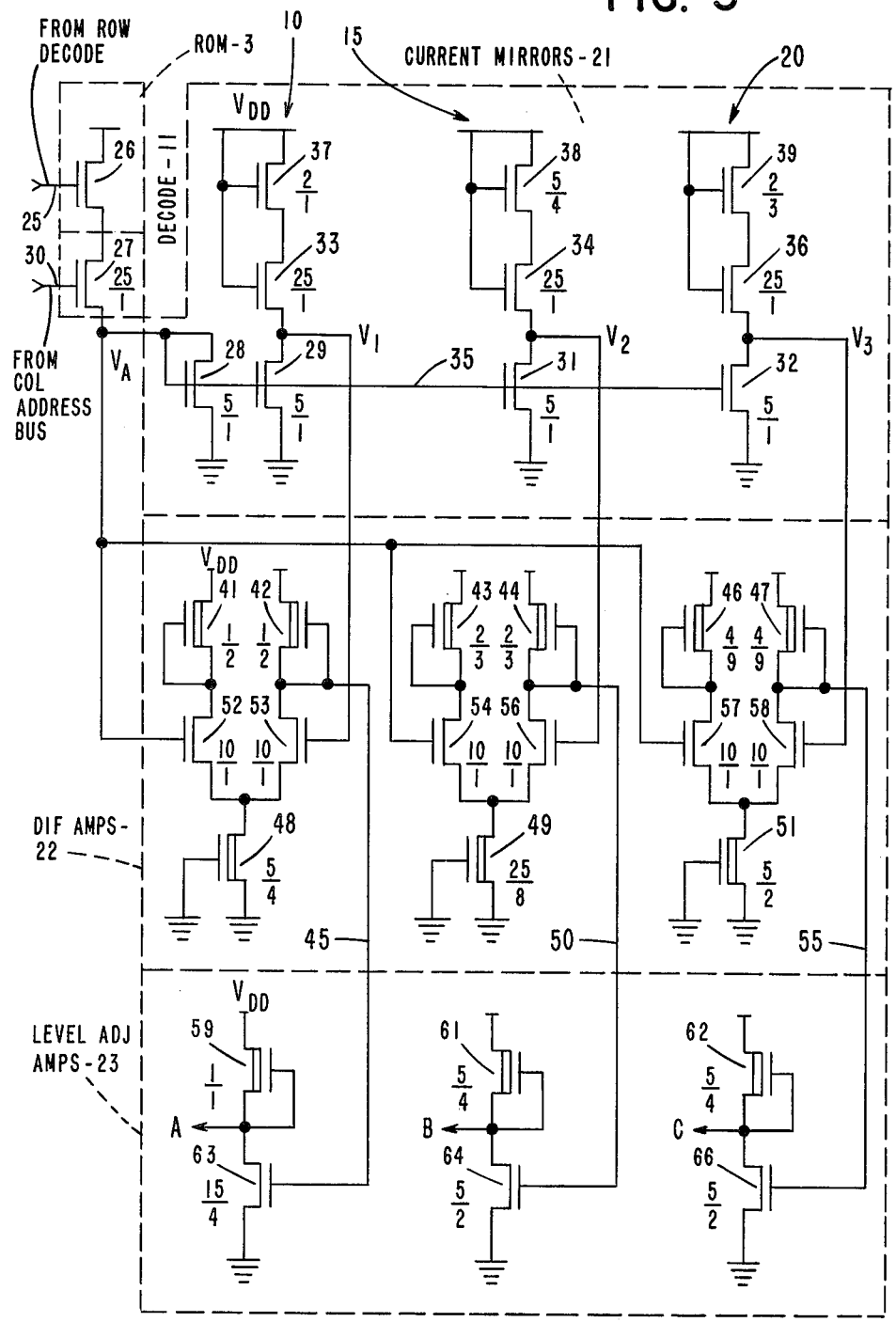
FIG. 3 is an electronic circuit schematically embodying the features of the sensing segment.

For purposes of the ensuing description the circuit in FIG. 3 is defined to encompass Sensing And Logic block 17 from the third bank in FIG. 1. However, FIG. 3 does also include the addressed cell from ROM Array 3, FET 26, and the addressing gate, FET 27, from Decode 11. Reference to FIG. 2 shows that Current Mirrors 21, Differential Amplifiers 22, and Level Adjusting Amplifiers 23 are essential constituents of Sensing And Logic blocks 14, 16 and 17.

The storage of n data bits in single ROM Cell FET 26 is accomplished according to the teachings in U.S. Pat. No. 4,192,014, cited previously. For purposes of the present embodiment, the four channel dimensions are prescribed at substantially even increments of impedance with FET structures having W/L ratios of 5/2, 7/4, 1/1 and no FET channel. Corresponding other FET dimensions are presented explicitly in FIG. 3. The relatively large W/L ratio, 25/1, of Decode FET 27 is representative for an addressed gating device, and is consistent for all the FETs in Decode 11. These dimensional parameters, as well as other design constraints noted herein, are typical for a Composite ROM System fabricated with n-channel FETs, contemporary dimensional design rules, and a $V_{DD}$ of 5 volts.

From a combination of the teachings in the prior art and the design constraints noted above, one of requisite skill in the art recognizes that the electrical node representing line $V_A$ potentially can exhibit four different voltage levels when ROM Array 3 is addressed. Given that line 25, connected to the gate electrode of FET 26, and line 30, connected to the gate electrode of FET 27, are energized by a voltage substantially equal to $V_{DD}$ when addressed, the voltage on line $V_A$ is dictated by the relative impedances of series-connected FETs 26, 27 and 28. Identical doping of enhancement type FETs during fabrication, and saturated mode operation of the FETs, transforms the relationship to one of structural dimensions. In terms of the circuit in FIG. 3, the magnitude of the voltage on $V_A$ is equal to the voltage on $V_{DD}$ decreased by the voltage drop incurred across FET 26, having four possible different impedance increments, and FET 27, having a fixed and relatively low impedance, in the sense of a voltage divider with FET 28. The extraction of information from ROM Array 3 relies upon the utilization of the various voltages appearing on line $V_A$, by virtue of a prescribed correspondence to dimensionally programmed data in the addressed ROM cell, FET 26.

According to the arrangement embodied in FIG. 3, Current Mirrors block 21 is comprised of a Current Mirror Reference FET, represented by gate-to-drain connected FET 28, and three parallel banks of current mirrors circuits, 10, 15 and 20, comprised of Current Mirror FETs 29, 31, and 32 together with their loads. All four current mirror FETs share common Gate Electrode 35. Note that for purposes of this embodiment FETs 28, 29, 31 and 32 are defined to be substantially identical in their dimensional and functional characteristics. The selection of a 5/1 width-to-length ratio ensures that all four current mirror FETs, 28, 29, 31 and 32, will conduct substantially identical currents, given the exemplary series impedances shown for each bank. Under those conditions, the voltages on lines $V_A$, $V_1$, $V_2$ and $V_3$ differ in proportion to the impedance of the series connected loads in the banks of Current Mirrors block 21.

The dimensions of Load FETs 33, 34 and 36 are selected to be substantially identical to the Decode FETs, exemplified by FET 27 in FIG. 3, to reproduce its effect in current mirror banks 10, 15 and 20. Thereby, the voltages on lines $V_1$, $V_2$ and $V_3$ differ from $V_A$ in proportion to the dimensional differences between ROM Array FET 26 and those corresponding to Load FETs 37, 38 and 39. If the fabrication process is adequately refined, the pair of load FETs in each bank of the current mirror, such as FETs 33 and 37, can be merged into a single device of effectively equivalent impedance.

At this point, one should recognize that the voltages on lines $V_A$, $V_1$, $V_2$ and $V_3$ are all variable, with the latter voltages depending both on the impedance of ROM Array FET 26 and their respective current mirror circuit impedances. Namely, the impedance of FET 26 establishes the current through FET 28 and the gate voltage on FET 28. The substantial identity of the transconductance for FETs 28, 29, 31 and 32 replicates the current through FET 28 in banks 10, 15 and 20 of the current mirror. However, the load impedance in each bank differs. Table I contains a summary of the relative voltages for the FET dimensions illustrated in FIG. 3, taking into account the variables noted above.

TABLE I

| Size of FET 26 | $V_A$ | $V_1$ | $V_2$ | $V_3$ |
|---|---|---|---|---|
| 5/2 | High | $<V_A$ | $<V_A$ | $<V_A$ |
| 7/4 | Medium | $>V_A$ | $<V_A$ | $<V_A$ |
| 1/1 | Low | $>V_A$ | $>V_A$ | $<V_A$ |
| Open circuit | FET 28 Threshold | $>V_A$ | $>V_A$ | $>V_A$ |

Table II presents an exemplary group of voltages for a Composite ROM System of the type described hereinbefore, under the condition that ROM Array FET 26 has a dimension of 1/1. For the example in Table II, the threshold voltage of the current mirror FETs was approximately 0.5 volts.

TABLE II

| Size of FET 26 | $V_A$ | $V_1$ | $V_2$ | $V_3$ |
|---|---|---|---|---|
| 1/1 | 1.5 | 2.7 | 1.8 | 1.0 |

Examination of the results confirms the comparative relationships of voltage levels presented in Table I.

The voltage relationships shown in Tables I and II illustrate the effects of some general design constraints utilized in the present embodiment to establish the design of the FETs in ROM Array 3, Decode 11 and Current Mirrors 21. With reference to FIG. 3, Load FETs 33, 34 and 36, as well as Decode FETs such as 27, have been selected to have relatively small impedance values, while Current Mirror Reference FET 28 and Current Mirror FETs 29, 31 and 32 are selected to have low to moderate impedances. In contrast, ROM Array FET 26 and Load FETs 37, 38 and 39 are prescribed to have relatively high impedances. Such constraints ensure adequate voltage variations and appropriate current levels in all current mirror FETs.

The series connection of two Load FETs, such as 33 and 37, in each bank of Current Mirrors 21 suggests that their impedances be combined into a single FET to further reduce chip area. Though it may be possible, care must be exercised to compensate for effects which are not linearly related to dimensional characteristics.

One distinct attribute of the current mirror circuit arrangement illustrated in FIG. 3 is the design and fabrication latitude remaining after the general design constraints described above have been satisfied. As an example, note that the value of the threshold voltage for Current Mirror Reference FET 28 and Current Mirror FETs 29, 31 and 32 may vary significantly as long as all four are relatively identical. The same is true of transconductance. For instance, the embodying circuit is readily operable when designed with FETs having threshold voltages ranging of 0–1 volt. Note that with a $V_{DD}$ of 5 volts, conventional integrated circuit processing prescribes a nominal 0.5 volt threshold for the enhancement mode FETs utilized in ROM Array 3, Decode 11 and Current Mirrors 21.

In contrast to the prior art, the present current mirror implementation for detecting the content in a ROM cell does not compare between a fixed set of reference voltages, such as might be formed with a resistor voltage divider circuit, and a ROM-generated voltage, but rather, relies upon predetermined relationships among variable reference voltages. Consequently, the critical dimensional and process tolerances associated with fabricating integrated circuit devices having distinct voltage levels are avoided and effectively replaced by dimensional and process constraints among adjacent and structurally similar devices.

Fortunately, the latter noted design characteristics are inherent in integrated circuits. It is commonly known that FETs which are dimensionally similar, close in relative proximity on a semiconductor chip, and subjected to a common fabrication process will, as a rule, have substantially identical functional characteristics. In terms of Composite ROM System 5 in FIG. 1, as further partially illustrated in FIG. 3, the proximity of ROM Array FET 26 to Load FETs 37, 38 and 39 will ensure that the dimensional characteristics are reflected in their impedance and transconductance. The same consistency is true of Decode FET 27 when compared to Load FETs 33, 34 and 36. And most notably, the immediate proximity of Current Mirror Reference FET 28 to Current Mirror FETs 29, 31 and 32 ensures their similarity not only in dimension, but in threshold voltage and channel conductivity characteristics.

To determine the relative size of addressed FET 26 in ROM Array 3, voltages $V_A$, $V_1$, $V_2$ and $V_3$ must be compared. As embodied in FIG. 3, the comparison is performed in Differential Amplifiers 22 by three banks of independent differential amplifier circuits. Since the structural arrangements and operational features of such differential amplifiers are relatively common knowledge, only the distinguishing aspects warrant specific mention. In this regard, note that Load FETs 41, 42, 43, 44, 46 and 47 are depletion mode devices. The same is true for Current Source FETs 48, 49 and 51. The dimensional differences in the load and current source FETs of the three parallel bank, i.e. FETs 41/42, 43/44, and 46/47, bias the operating levels of Differential FETs 52/53, 54/56, and 57/58 to their high gain regions. Again, such refinements are generally known in the art.

Proceeding with FIG. 3, the three output lines from Differential Amplifiers 22, lines 45, 50 and 55, are coupled into three parallel banks of Level Adjusting Amplifiers, block 23. As shown, Load FETs 59, 61 and 62 are depletion mode devices, while Inverting FETs 63, 64 and 66 are of the enhancement mode. The relatively minor dimensional differences in the various FETs optimize gain and eliminate bias levels.

The three output voltages from Level Adjusting Amplifiers 23, on lines A, B and C, are binary representations of the relative comparisons among voltages $V_A$, $V_1$, $V_2$ and $V_3$. According to Table I, the binary code of relationships on lines A, B and C defines the dimensions of the addressed ROM Array FET.

The conversion from binary voltages on lines A, B and C to binary data on two bit lines is performed according to the logic relationship defined in Table III.

TABLE III

| A | B | C | $D_1$ | $D_2$ |
|---|---|---|---|---|
| 0 | 0 | 0 | 0 | 0 |
| 0 | 0 | 1 | 0 | 1 |
| 0 | 1 | 1 | 1 | 1 |
| 1 | 1 | 1 | 1 | 0 |

The binary output signals on lines $D_1$ and $D_2$ are also defined mathematically by the following Boolean algebra equations.

$$D_1 = \overline{A}BC + ABC = B$$

$$D_2 = \overline{A}\overline{B}C + \overline{A}BC = \overline{A}C$$

Figure 4:
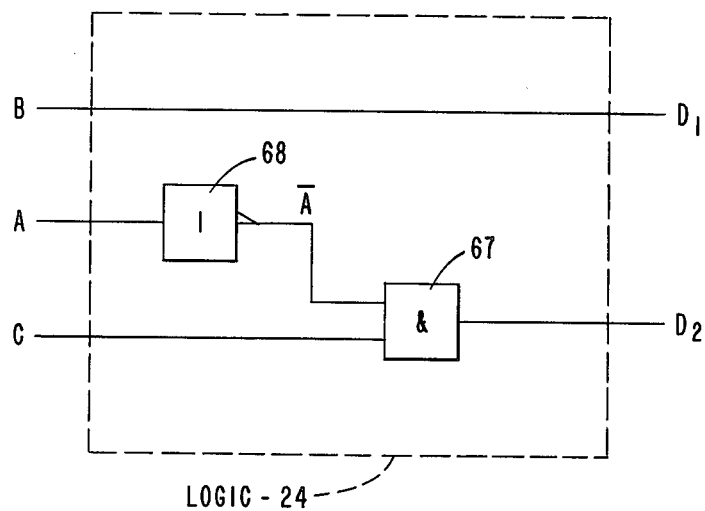
FIG. 4 is a schematic block diagram of an exemplary logic segment.

A circuit implementation of these logic relationships is illustrated in FIG. 4 using simple AND and OR gates. The signal for line $D_1$ is identical to that on line B. The signal on $D_2$ is the outcome of AND Gate 67, whose inputs are the output of inverter 68 and line C.

Returning to FIG. 1 of the drawings, it should be recognized that each pair of output lines from Sensing And Logic blocks 14, 16 and 17, in this case lines such as $D_1$ and $D_2$, are subject to further selection in Decode block 18 according to the address on Z Address Bus 19. As was true of the prior art, the need for Decode 18 depends on the number of lines entering the Decode, as well as the number of bit lines representing the Data Out.

Though the present invention has been described by way of a specific embodiment, the true teaching encompasses a significantly broader scope of applications. As a first example, it should be recognized that each ROM Array FET, such as FET 26 in FIG. 3, is theoretically capable of storing n bits of data. To determine that data, each Sensing And Logic block in FIG. 1, e.g. 14, 16 or 17, requires $2^n - 1$ banks of Current Mirror FETs, not counting Current Mirror Reference FET 28 (FIG. 3), $2^n - 1$ banks of Differential Amplifiers, and $2^n - 1$ banks of Level Adjusting Amplifiers to distinguish between the potential memory cell impedances. In addition, it should be recognized that the structural and functional similarities of the successive banks of circuits in FIG. 3, as well as the bias voltages coupled thereto, illustrate merely one of many variable arrangements by which the essential features of the present invention may be practiced. In like manner, the dashed lines in FIG. 1 represent an unrestricted expansion of the composite ROM system. Foremost, it should be recognized that the invention relates to impedance comparisons, which though prevalent in ROM arrays are not limited to those applications alone. These and other related refinements remain within the scope and spirit of the present invention as taught and claimed herein.

I claim:

1. An impedance comparator, comprising:
   a first field effect transistor having the gate and drain electrodes connected to a first node;
   means for connecting a first, unknown impedance to said first node;
   means for biasing said first field effect transistor with a first voltage source connected through said first impedance;
   the second field effect transistor having a defined operational relationship to said first field effect transistor, connected through a second node into conductive series with a second impedance;
   means for biasing said second field effect transistor with a second voltage source connected through said second impedance;
   means for connecting the gate electrode of said second field effect transistor to the gate electrode of said first field effect transistor; and
   means for comparing the amplitude of the voltage on said first node with the amplitude of the voltage on said second node to determine the relative magnitude of said first impedance.

2. The impedance comparator recited in claim 1, further comprising:
   a third field effect transistor having a defined operational relationship to said first field effect transistor, connected through a third node into conductive series with a third impedance;
   means for biasing said third field effect transistor with a third voltage source connected through said third impedance;
   means for connecting the gate electrode of said third field effect transistor to the gate electrode of said first field effect transistor; and
   means for comparing the amplitudes of the voltage on said third node with the amplitudes of the voltages on said first and second modes.

3. The impedance comparator recited in claim 2, extended to include a total of $2^n$ field effect transistors, $2^n$ nodes, $2^n$ impedances, $2^n$ voltage sources, a common connection of all field effect transistor gate electrodes, and means for comparing the amplitudes of the voltages on said $2^n$ nodes, wherein $n \geq 2$.

4. The impedance comparator recited in claim 3, wherein said $2^n$ voltage sources provide substantially identical voltages.

5. The impedance comparator recited in claim 4, wherein said means for comparing the amplitudes of the voltages generates a binary output signal in relation to the comparative amplitude of the voltage on said first node to each of the remaining $2^n - 1$ nodes.

6. The impedance comparator recited in claim 5, wherein said $2^n$ field effect transistors have substantially identical dimensional and operational characteristics.

7. The impedance comparator recited in claim 6, further including logic circuit means, coupled to said means for comparing the amplitudes of the voltages, for generating a binary output signal corresponding to the magnitude of said first impedance in relation to the remaining $2^n - 1$ impedances.

8. The impedance comparator recited in claim 7, wherein said first impedance is the effective impedance of a ROM cell field effect transistor, having n potentially different values, and said first field effect transistor is a reference for the remaining $2^n - 1$ field effect transistors operable in a current mirror arrangement.

9. The impedance comparator recited in claim 8, wherein said second and all numerically succeeding impedances are comprised of two field effect transistors connected in conductive series to replicate the series combination of a decode field effect transistor and said ROM cell field effect transistor.

10. The impedance comparator recited in claim 9, wherein said field effect transistors, said impedances, and said ROM cells are in close physical proximity on a commonly fabricated semiconductor wafer.

* * * * *